United States Patent [19]

Kan et al.

[11] Patent Number: 5,438,289
[45] Date of Patent: Aug. 1, 1995

[54] COMPARATOR CIRCUIT

[75] Inventors: Rikiya Kan; Yasuo Shimomura, both of Tsurugashima, Japan

[73] Assignee: Toko, Inc., Tokyo, Japan

[21] Appl. No.: 157,701

[22] Filed: Nov. 24, 1993

[30] Foreign Application Priority Data

Nov. 27, 1992 [JP] Japan ................... 4-339508

[51] Int. Cl.$^6$ .............................................. H03K 5/153
[52] U.S. Cl. .................................... 327/97; 327/91; 327/72; 327/73
[58] Field of Search ................ 307/358, 359, 350, 352

[56] References Cited
FOREIGN PATENT DOCUMENTS 2355214  7/1994  Germany .............. 307/350

OTHER PUBLICATIONS

Sedra/Smith Microelectronic Circuits Third Edition 1991 pp. 894, 895.

*Primary Examiner*—Timothy P. Callahan
*Assistant Examiner*—Jung Ho Kim

[57] ABSTRACT

The present invention relates to a comparator circuit which is arranged such that detected data signal is waveform-shaped without producing any bit error, so that the data signal as transmitted can be accurately demodulated. Reference voltage $V_{RE}$ of the comparator which is compared with the data signal $V_{IN}$ is provided by adding output resulting from integration of the data signal $V_{IN}$ and integrated output of an inverter 2 which inverts output of the comparator 1. The reference voltage $V_{RE}$ of the comparator 1 can always be located at the center between the high level and the low level of the data signal $V_{IN}$ despite variations in DC voltage level of the data signal $V_{IN}$.

2 Claims, 8 Drawing Sheets

COMPARATOR CIRCUIT

BACKGROUND OF THE INVENTION

1. Field of the Invention

This invention relates to a comparator circuit which is usable for the purpose of shaping and demodulating the waveform of data signal as detected in a receiver when it is attempting to demodulate data signal which is radiotransmitted from a transmitter in data communications.

2. Description of the Prior Art

In the case where data signal is transmitted from a radio transmitter of the type that the data signal is directly modulated through the use of a voltage-controlled oscillator incorporated in a PLL circuit, the data signal as detected in a receiver may tend to change in terms of DC voltage level used as reference, due to the frequency characteristics of demodulator of the transmitter and the characteristics of loop filter of the PLL circuit.

Furthermore, the data signal may include noise in an area of a weak electric field. It has conventionally been the practice that such data signal is used as output of a receiver by being waveform-shaped and demodulated by the use of a comparator circuit; with such practice, however, it often happens that error occurs in the data signal outputted from the receiver.

To provide a better understanding of the present invention, description is now given as to FIGS. 7 to 10 of the accompanying drawings.

FIG. 7 illustrates the voltage waveform of data signal having a varying DC voltage level which is obtained by detecting the waveform of data signal as transmitted, in a receiver, i.e., waveform of detection output. The detected data signal $V_{IN}$ changes in terms of the DC voltage level L1 that serves as a reference. Such data signal $V_{IN}$ is applied to a comparator circuit so as to be subjected to further waveform-shaping and demodulation. In FIG. 7 and the succeeding drawings, the abscissa represents time, and the ordinate indicates voltage level.

FIG. 8 is a circuit diagram illustrating a conventional comparator circuit. In comparator 23, detected data signal $V_{IN}$ applied to a terminal 21 is compared with a reference voltage $V_{RE1}$ obtained by dividing power supply voltage $V_{CC}$ provided to a terminal 20, by means of resistors R20 and R21, so that when the data signal $V_{IN}$ goes above the reference voltage $V_{RE1}$, the comparator provides a high-level output.

FIG. 9 shows waveforms which occur in the circuit of FIG. 8, and voltage waveform of data signal as transmitted from transmitter. More specifically, FIG. 9(A) represents the voltage waveform of the data signal $V_{IN}$ as detected together with the reference voltage $V_{RE1}$; FIG. 9(B) shows the voltage waveform of output $V_0$ of the comparator 23; and FIG. 9(C) indicates the voltage waveform of data signal $V_S$ as transmitted from transmitter.

Since the reference voltage $V_{RE1}$ is fixed, the position of the cross-point between the data signal $V_{IN}$ and the reference voltage $V_{RE1}$ (threshold voltage of the comparator 23) changes with time with respect to the data signal $V_{IN}$.

The data signal $V_S$ as transmitted is of a perfect rectangular waveform, but when radio-transmitted, the data signal is restrained by adjacent channel leakage power so that it is modulated through a low pass filter in the transmitter. Thus, the data signal $V_{IN}$ resulting from the detection takes a pulse waveform wherein duty ratio changes at the rise and fall portions thereof, instead of such a perfect rectangular waveform as that of the data signal $V_S$.

Thus, when the data signal $V_{IN}$ is compared with the reference voltage $V_{RE1}$ at the center of the amplitude thereof, the waveform of the data signal $V_S$ as transmitted from the transmitter is obtained as output of the comparator 23 so that waveform shaping is effected satisfactorily. If the position of the reference voltage $V_{RE1}$ is shifted upwardly and downwardly from the center due to variations in the DC voltage level of the data signal $V_{IN}$, however, the waveform of the output $V_0$ obtained from the comparator 23 turns out different in respect of duty ratio from the data signal $V_S$ transmitted from the transmitter.

A comparison of the output $V_0$ and the data signal $V_S$ reveals that part 91 of the output $V_0$ is narrower than the corresponding part 81 of the data signal $V_S$. This is due to the fact that at the part 71 of the data signal $V_{IN}$ which corresponds to the part 81 of the data signal $V_S$, comparison of the date signal $V_{IN}$ and the reference voltage $V_{RE1}$ is effected at a position which is close to the low level and where the waveform becomes narrower.

Further, part 92 of the output waveform $V_0$ is broader than corresponding part 82 of the data signal $V_S$. This is due to the fact at that part 72 of the data signal $V_{IN}$ which corresponds to the part 82 of the data signal $V_S$, comparison of the data signal $V_{IN}$ and reference voltage $V_{RE1}$ is effected at a position which is close to the high level and where the waveform becomes broader.

Part 93 of the output waveform $V_0$ also is broader than corresponding part 83 of the data signal $V_S$. This is due to the fact that comparison of that part 73 of the data signal $V_{IN}$ which corresponding to the part 83 of the data signal $V_S$ and the reference voltage $V_{RE1}$ is effected at a position which is close to the high level and where the waveform becomes broader.

The high level and low level of the data signal $V_{IN}$ represents bit information; thus, due to the difference from the data signal $V_S$ of the output $V_0$ derived from the comparator the 23, bit error is caused to occur so that error signal which is not based on the data signal $V_{IN}$ is transmitted.

FIG. 10 is a circuit diagram showing another conventional comparator circuit. Detected data signal $V_{IN}$ applied to terminal 30 is passed to an integrating circuit consisting of a resistor R30 and capacitor C30, and comparison of the output of the integrating circuit used as the reference voltage $V_{RE1}$, and the data signal $V_{IN}$ is effected in the comparator 32.

FIG. 11 illustrates the waveform of the data signal $V_{IN}$ in which DC voltage level L1 varies, and that of the reference voltage $V_{RE1}$ in the circuit of FIG. 10. The reference voltage $V_{RE1}$, varies with a variation in the DC voltage level L1. More specifically, the reference voltage $V_{RE1}$ approaches the high level as persistency of the high level of the data signal $V_{IN}$ increases, while it approaches the low level as persistency of the low level of the data signal $V_{IN}$ increases. As a result, the reference voltage $V_{RE1}$, occurs dominantly at the site where more contiguous-bit information occurs. The reference voltage $V_{RE1}$ varies behind the bit information.

As will be seen from the above discussion, the conventional comparator circuits of FIGS. 8 and 10 is disadvantageous in that bit error is often caused to occur in the output of the comparator circuit due to the fact that the reference voltage $V_{RE1}$ which is compared with the the data signal $V_{IN}$ is not located at the center of the amplitude of the data signal $V_{IN}$.

SUMMARY OF THE INVENTION

It is an object of the present invention to provide a comparator circuit which is so designed as to effect waveform-shaping of data signal as detected in a receiver, without causing bit error to occur, thereby accurately demodulating the data signal as transmitted.

The comparator circuit according to the present invention comprises a first integrating circuit to which an input signal is applied, a comparator, an inverter for inverting the output of the comparator, and a second integrating circuit to which the output of the inverter is applied, wherein reference voltage for the comparator is obtained by adding the output of the second integrating circuit to the output of the first integrating circuit.

As will be appreciated, with the comparator circuit of the present invention, the reference voltage of the comparator which is compared with input signal, is obtained by adding an integrated version of input signal and an integrated version of inverter output which is an inverted version of the output of the comparator.

In case the DC voltage level of the input signal varies, output resulting from integration of the input signal quickly changes with the variation of the DC voltage level.

Thus, according to the present invention, the reference voltage of the comparator can be changed with variation in the DC voltage level of the input signal so that it can always be located at the center between the high level and the low level of the waveform of the input signal.

Further, accurate output is derived from the comparator irrespective of variations in the DC voltage level of the input signal, thus there occurs no bit error.

A further advantage is that even if small noise is superimposed upon data signal, the data signal can be demodulated without being influenced by such noise. This constitutes an important feature from the practical point of view.

Other objects, features and advantages of the present invention will become apparent from the ensuing description taken in conjunction with the accompanying drawings.

DESCRIPTION OF THE PREFERRED EMBODIMENTS

Figure 1:
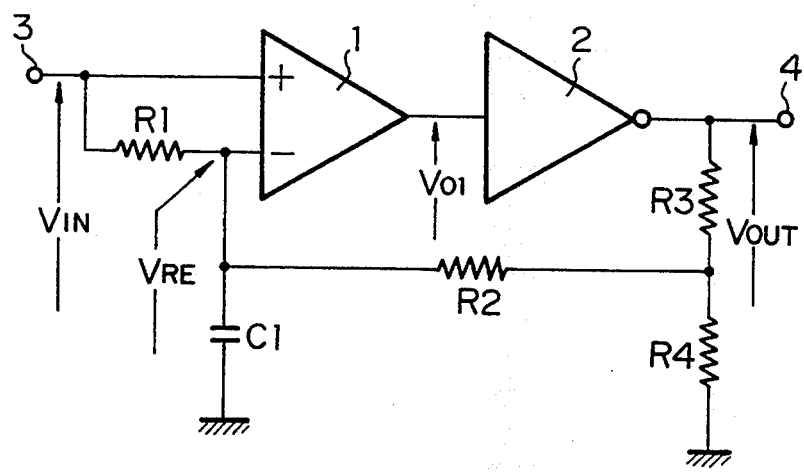
FIG. 1 is a circuit diagram showing the comparator circuit according to an embodiment of the present invention.

Referring to FIG. 1, there is shown a circuit diagram of the comparator circuit according to an embodiment of the present invention, which includes a comparator 1, an inverter 2, and an input terminal 3 connected to a non-inverting input terminal (+) of the comparator 1.

A resistor R1 and capacitor C1 constitutes a first integrating circuit wherein the input side end of the resistor R1 is connected to the input terminal 3, and the connection point between the output side end of the resistor R1 and the capacitor C1 is tied to an inverting input terminal (−) of the comparator 1.

The comparator 1 is connected at the output side thereof to the input side of the inverter 2, the output terminal of which is connected at the output side thereof to an output terminal 4 and also to a voltage divider circuit consisting of a resistor R3 and R4 connected in series with each other.

The connection point between the resistors R3 and R4 is connected to the inverting input terminal (−) of the comparator 1 via resistor R2. The resistor R2 and capacitor C1 constitutes a second integrating circuit, the capacitor C1 being shared by the first and second integrating circuits.

With such comparator circuit arrangement, a data signal $V_{IN}$ is applied via the input terminal 3 to the non-inverting input terminal (+) of the comparator 1. The data signal $V_{IN}$ is also applied to the first integrating circuit, the output of which in turn is applied to the inverting input terminal (−) of the comparator 1.

Output $V_{01}$ of the comparator 1 is inverted by the inverter 2, and output $V_{OUT}$ of the inverter 2 is divided by the divider circuit consisting of the resistors R3 and R4 and then applied to the second integrating circuit. Output of the second integrating circuit is applied to the inverting input terminal (−) of the comparator 1, together with output of the first integrating circuit Input signal of the comparator circuit is data signal $V_{IN}$, and as output signal subjected to waveform-shaping and demodulation, either the output $V_{OUT}$ of the inverter 2 or the output $V_{01}$ of the comparator 1 is employed.

Figure 2:
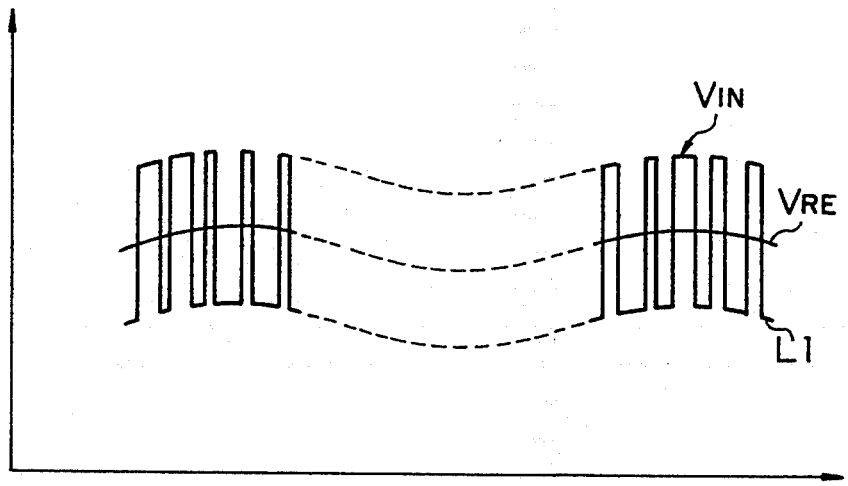
FIG. 2 illustrates the waveforms of data signal as detected and reference voltage in the comparator circuit of the present invention.

FIG. 2 is a voltage waveform diagram illustrating the relationship between data signal and reference signal in the comparator circuit of FIG. 1, wherein the reference voltage $V_{RE}$ can always be centered between the high level and the low level of the data signal $V_{IN}$ even if the DC voltage level L1 of the data signal $V_{IN}$ varies.

Referring to FIG. 3, description will now be made of the reference voltage $V_{RE}$ which varies following variations in the DC voltage level L1 of the data signal $V_{IN}$ despite such variations.

FIG. 3 shows voltage waveforms which occur in the circuit of FIG. 1 wherein (A) represents detected data signal $V_{IN}$ and output $V_{R1}$ of the first integrating circuit; (B) shows voltage waveforms of the output $V_{OUT}$ of the inverter 2 and output $V_{R2}$ of the second integrating circuit; (C) indicates voltage waveforms of the output $V_{RE}$ of the first integrating circuit, output $V_{R2}$ of the second integrating circuit, and the reference voltage $V_{RE}$ obtained by adding the outputs $V_{R1}$ and $V_{R2}$; and (D) shows the voltage waveforms of the reference voltage $V_{RE}$ and data signal $V_{IN}$.

FIG. 3 illustrates the case where bit information of the data signal $V_{IN}$ includes more high level components than low level ones as shown at (A).

In the comparator 1, data signal $V_{IN}$ such as shown at (A) in FIG. 3 and ripple-containing output $V_{R1}$ of the first integrating circuit are compared with each other so that when the data signal $V_{IN}$ exceeds the output $V_{R1}$, the comparator 1 provides output at the high level.

Thus, the output $V_{OUT}$ of the inverter 2 is provided which is an inverted version of the output of the comparator I such as shown at (B) in FIG. 3. The output $V_{OUT}$ is applied to the second integrating circuit which in turn provides output $V_{R2}$.

The output voltages $V_{R1}$ and $V_{R2}$ occur in vertically opposing relationship with each other in terms of voltage level as shown at (C) in FIG. 3, so that the ripples in these output voltages occur In inverted relationship with each other in respect of waveform and phase at the same point of time. Thus, a voltage containing less ripple, which results from addition of the output voltages $V_{R1}$ and $V_{R2}$, is applied as reference voltage $V_{RE}$ to the inverting input terminal (−) of the comparator 1 except during the initial time period.

Since the reference voltage $V_{RE}$ contains less ripple, this means that the time constants of the first and second integrating circuits can be decreased. Furthermore, it is also possible to locate the level of the reference voltage $V_{RE}$ at the center between the high level and the low level of the data signal $V_{IN}$.

If the DC voltage level L1 of the data signal $V_{IN}$ varies, then the DC voltage level of the output voltage $V_{R1}$ also varies; thus, the reference voltage $V_{RE}$ can always be located at the center of the amplitude of the data signal $V_{IN}$ by being varied in accordance with the DC voltage level L1.

The fact that tile time constants of the integrating circuits can be decreased contributes to quick follow-up with respect to variations in the DC voltage level L1 of the data signal $V_{IN}$.

Figure 3A:
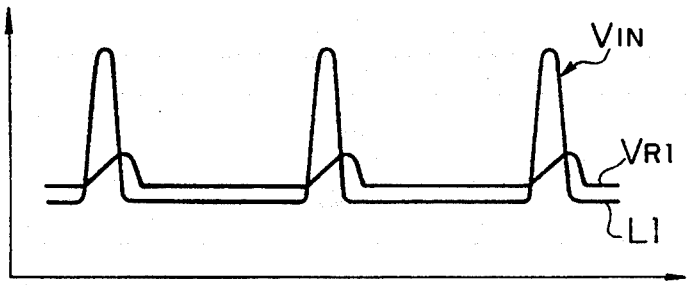
FIG. 3 shows voltage waveforms occurring in the circuit of FIG. 1.
Figure 3B:
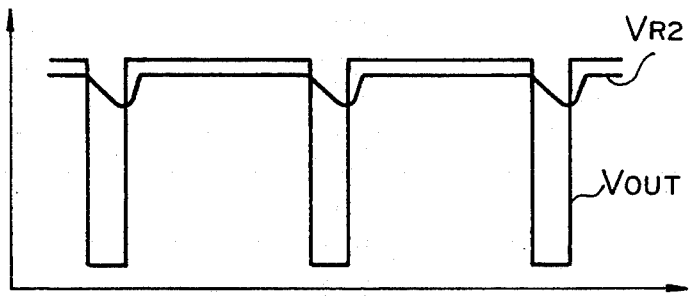
Figure 3C:
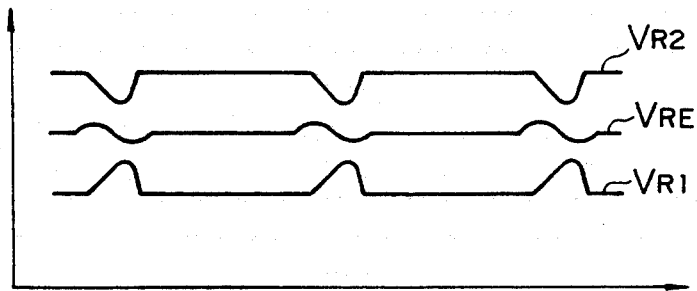
Figure 3D:
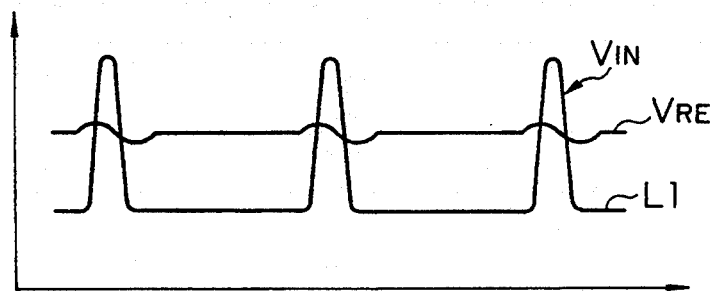

If the DC voltage level L1 of the data signal $V_{IN}$ varies to become higher, i.e., upwardly In FIG. 3(A), for example, then the reference level of tile output voltage $V_{R1}$ and thus the reference voltage $V_{RE}$ will also vary to become higher.

Figure 12:
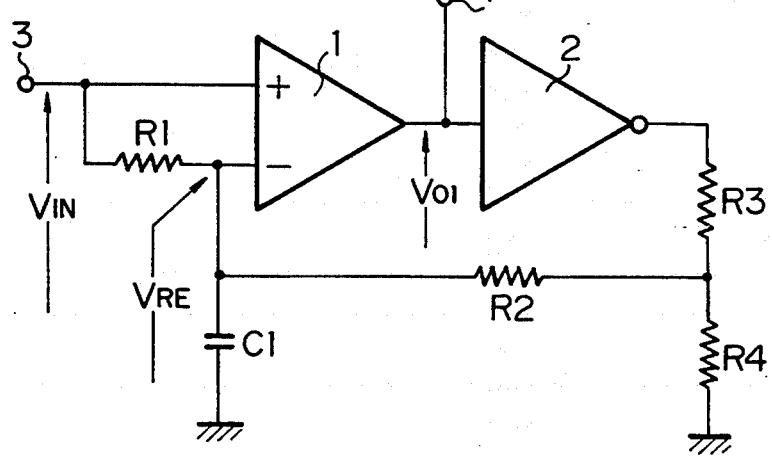
FIG. 12 is a circuit diagram showing the comparator circuit according to another embodiment of the present invention.

The output $V_{OUT}$ of the inverter 2 is used as output signal of the comparator circuit; however, since the output is inverted in waveform with respect to the data signal $V_{IN}$ it is also possible that the output may be used as output signal after having been passed through another inverter circuit as desired. In case the output $V_{01}$ of the comparator 1 is used as output signal of the comparator circuit, output terminal 4 is connected to the output side of the comparator 1 as shown In FIG. 12 which is a circuit diagram illustrating the comparator circuit according to another embodiment of the present invention.

The time period that elapses before the reference voltage $V_{RE}$ is very short.

The input terminals of the comparator 1 to which the input signal and reference voltage are applied respectively may be changed from the embodiment.

Figure 4A:
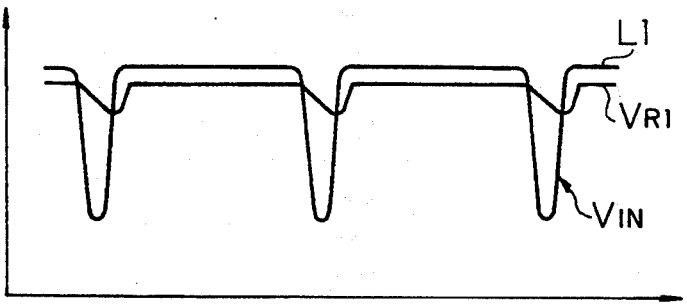
FIG. 4 shows further voltage waveforms occurring in the circuit of FIG. 1.
Figure 4B:
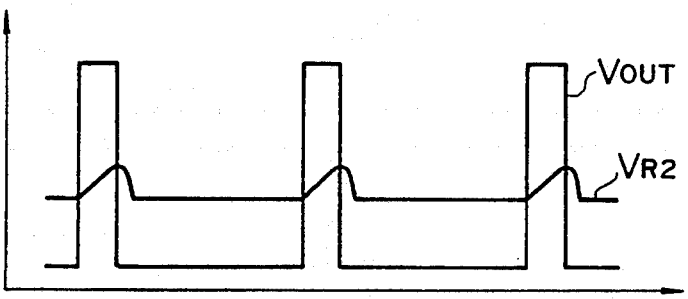
Figure 4C:
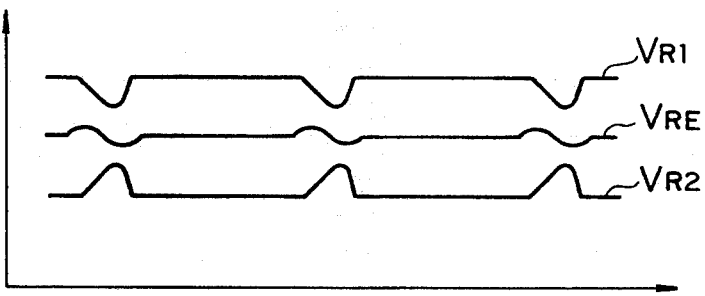
Figure 4D:
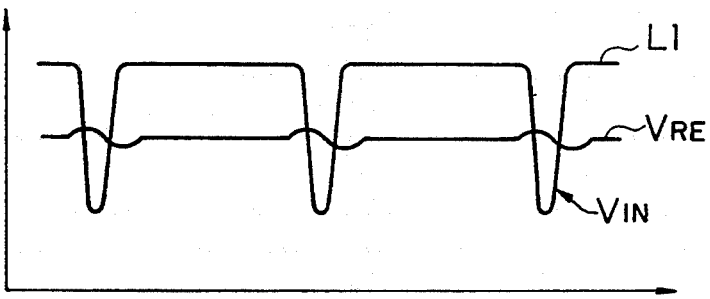

FIG. 4 shows another set of waveforms which occur in the circuit of FIG. 1, wherein FIG. 4(A) shows the waveforms of data signal $V_{IN}$ as detected and output $V_{R1}$ of the first integrating circuit; FIG. 4(B) shows the waveforms of output $V_{OUT}$ of the inverter 2 and output $V_{R2}$ of the second integrating circuit; FIG. 4(C) shows the waveforms of output $V_{R1}$ of the first Integrating circuit, output $V_{R2}$ of the second integrating circuit, and reference voltage $V_{RE}$ resulting from addition of the outputs $V_{R1}$ and $V_{R2}$; and FIG. 4(D) shows the waveforms of the reference voltage $V_{RE}$ and data signal $V_{IN}$.

FIG. 4 illustrates the case where the bit information of the data signal $V_{IN}$ includes more high level components than low level ones, as shown at (A).

While the relationship in reference level between the output $V_{R1}$ of the first integrating circuit and the output $V_{R2}$ of the second integrating circuit is reversed with respect to that of FIG. 3, their waveforms are such that ripple components occur in inverted relationship with each other substantially at the same point of time. Thus, even if the bit information of the data signal $V_{IN}$ is varied, the level of the reference voltage $V_{RE}$ can be located at the center of the data signal $V_{IN}$ as is the case with FIG. 3. Further, it is possible to achieve quick follow-up with respect to variations in the DC voltage level L1 of the data signal $V_{IN}$.

Figure 5A:
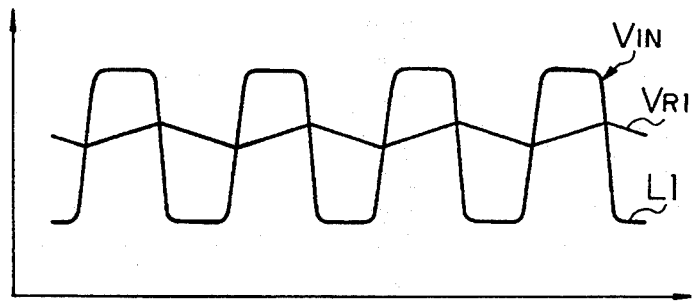
FIG. 5 shows still further voltage waveforms occurring in the circuit of FIG. 1.
Figure 5B:
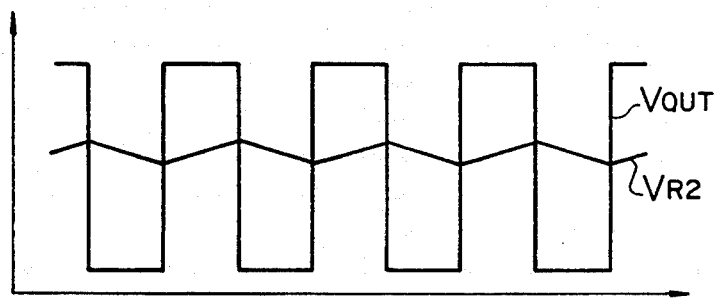
Figure 5C:
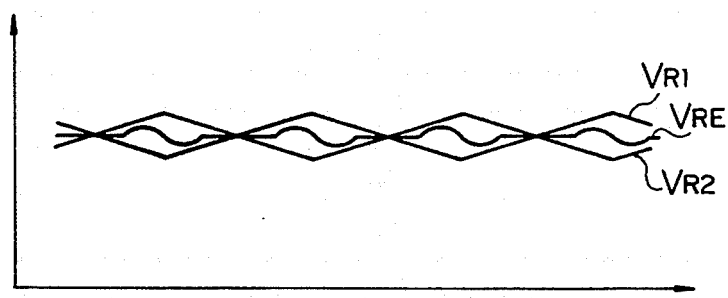
Figure 5D:
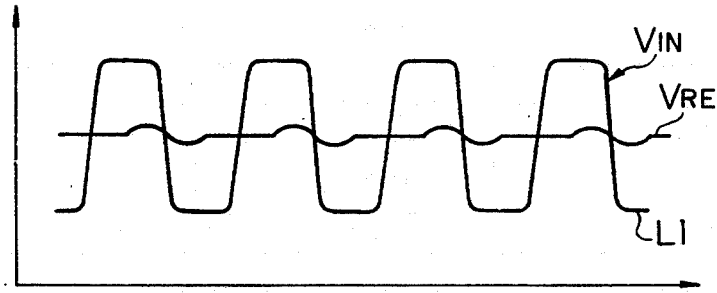

FIG. 5 illustrates a still another set of waveform which occur in the circuit of FIG. 1, wherein FIG. 5(A) shows the waveforms of data signal $V_{IN}$ as detected and output $V_{R1}$ of the first integrating circuit; FIG. 5(B) shows the waveforms of output $V_{OUT}$ of the inverter 2 and output $V_{R2}$ of the second integrating circuit; FIG. 5(C) shows the waveforms of output $V_{R1}$ of the first integrating circuit, output $V_{R2}$ of the second integrating circuit, and reference voltage $V_{RE}$ resulting from addition of the outputs $V_{R1}$ and $V_{R2}$; and FIG. 5(D) shows the waveforms of the reference voltage $V_{RE}$ and data signal $V_{IN}$.

FIG. 5 shows the case where the bit information of the data signal $V_{IN}$ is substantially the same at low and high levels, as shown at (A).

The vertical spacing in reference level between the output $V_{R1}$ of the first integrating circuit and the output $V_{R2}$ of the second integrating circuit is narrow, and those outputs include less ripple; however, their waveforms are such that ripple components occur in inverted relationship with each other substantially at the same point of time, and thus the level of the reference voltage $V_{RE}$ can still be located at the center of the data signal $V_{IN}$.

Figure 6A:
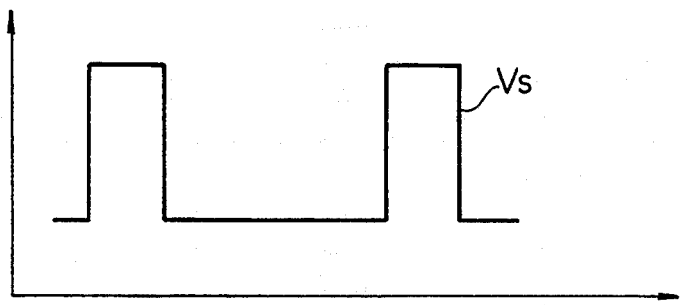
FIG. 6 illustrates how voltage waveform is shaped when noise is superimposed upon data signal as detected.

FIG. 6 illustrates the manner in which voltage waveform is shaped when small noise is superimposed upon data signal $V_{IN}$ as detected, wherein FIG. 6(A) shows the waveform of the data signal $V_S$ as transmitted; FIG. 6(B) shows the waveform of the data signal $V_{IN}$ as detected; FIG. 6(C) shows the waveform of output $V_0$ of the conventional comparator circuit shown in FIG. 8; and FIG. 6(D) shows the waveform of output $V_{01}$ of the comparator 1 shown in FIG. 1.

Figure 6B:
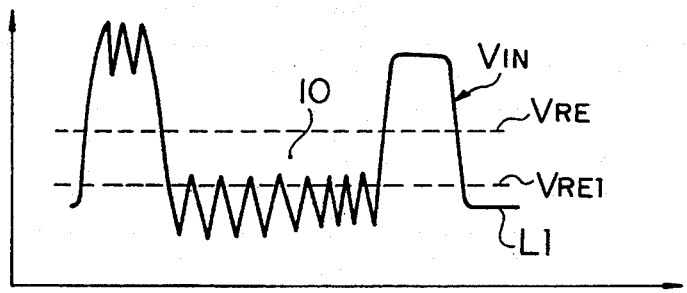
Figure 6C:
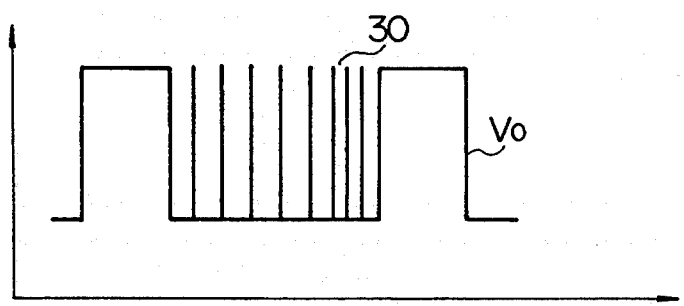

With the comparator circuit of the present invention, the voltage level of the reference voltage $V_{RE}$ is centered between the high level and the low level of the data signal $V_{IN}$ as shown by broken lines in FIG. 6(B). Ripple of the reference voltage $V_{RE}$ is not shown.

Figure 6D:
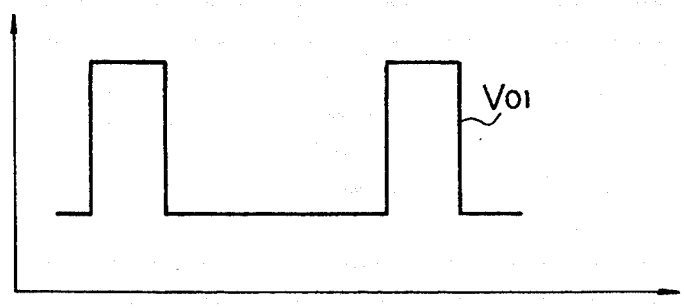
Figure 7:
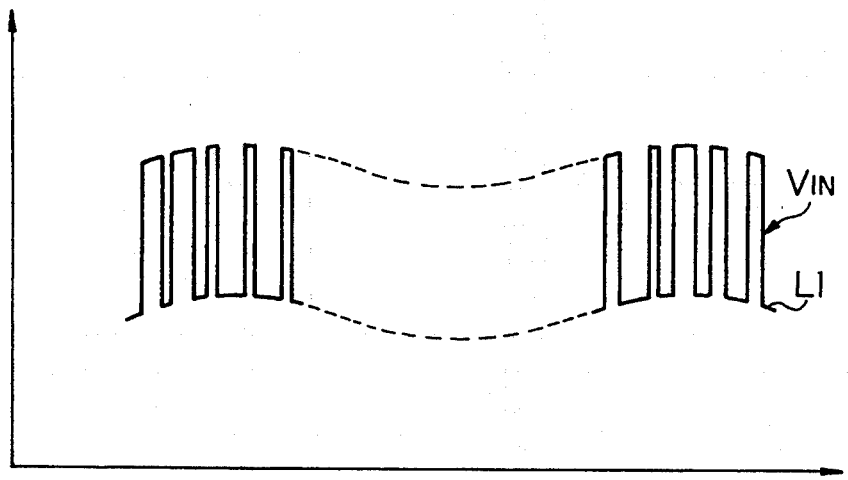
FIG. 7 shows voltage waveform of data signal obtained by detecting a modulated signal having a varying DC voltage level in a receiver.

Even if small noise is superimposed upon the data signal $V_{IN}$ at part 10 thereof, the level of the noise is spaced apart from that of the reference voltage $V_{RE}$ so that it is not detected in the comparator 1. Thus, the output $V_{01}$ of the comparator 1 has the same waveform as that of the data signal $V_S$ as shown in FIG. 6(D).

Figure 8:
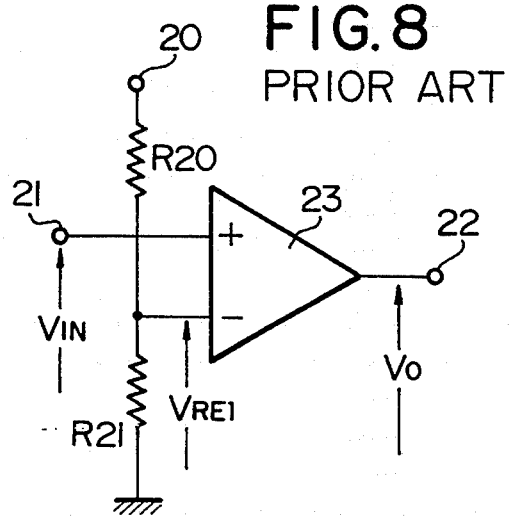
FIG. 8 is a circuit diagram showing a conventional comparator circuit.
Figure 9A:
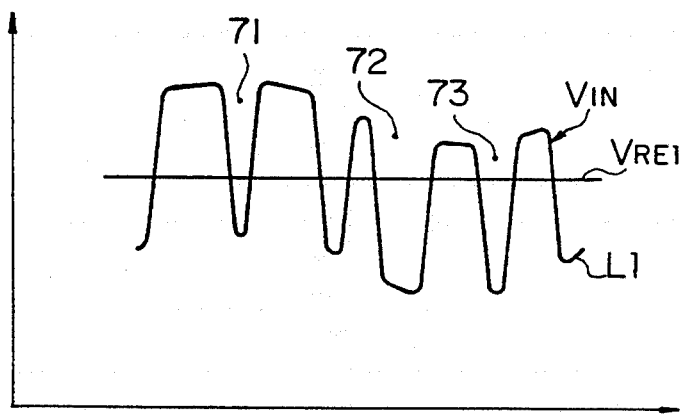
FIG. 9 shows voltage waveforms occurring in the circuit of FIG. 8, and voltage waveform of data signal as transmitted from a transmitter.
Figure 9B:
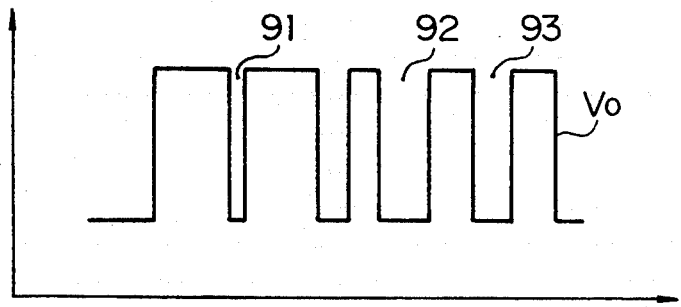
Figure 9C:
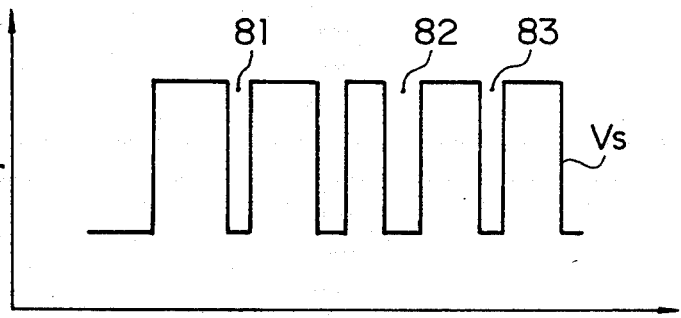
Figure 10:
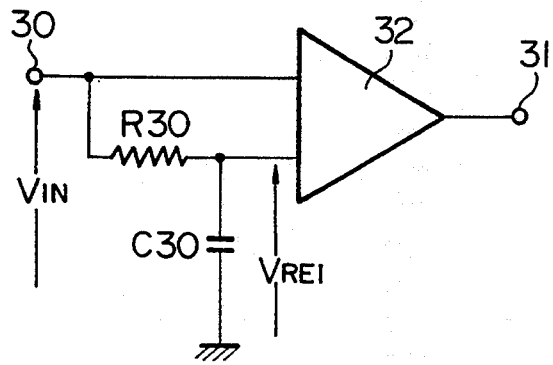
FIG. 10 is a circuit diagram showing another conventional comparator circuit.
Figure 11:
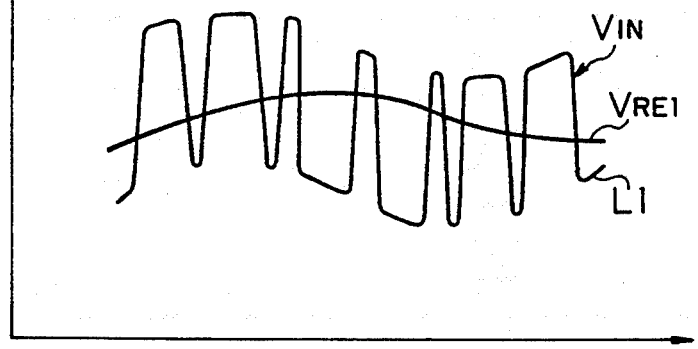
FIG. 11 illustrates waveforms of data signal having a varying DC voltage level and reference voltage, which occur in the circuit of FIG. 10.

If the level of the reference voltage is deviated downwardly from the center of the data signal $V_{IN}$, for example, like reference voltage $V_{RE1}$ shown by a dotted line, then the level of noise reaches that of the reference voltage $V_{RE1}$ so that the comparator 23 of FIG. 8 detects noise.

At that part 30 of output $V_0$ of the comparator 23 which corresponds to the part 10 of the data signal $V_{IN}$, noise appears as bit information. It will be apparent that such noise causes bit error to occur.

While the present invention has been illustrated and described with respect to specific embodiments thereof, it is to be understood that the present invention is by no means limited thereto but encompasses all changes and modifications which will become possible within the scope of the appended claims.

We claim:

1. A comparator circuit comprising: a comparator arranged such that input signal and reference voltage are applied to separate input terminals respectively; an inverter for inverting output of said comparator; a first and a second integrating circuit; and a capacitor shared by said first and second integrating circuits, wherein the reference voltage applied to the comparator is provided by adding output of the first integrating circuit to which said input signal is applied and output of the second integrating circuit to which output of said inverter is applied, and the output of said inverter or the output of said comparator is used as output signal.

2. A comparator circuit comprising: a comparator arranged such that input signal and reference voltage are applied to separate input terminals respectively; an inverter for inverting output of said comparator; a first and a second integrating circuit; and a capacitor shared by first and second integrating circuits, wherein the reference voltage applied to the comparator is provided by adding output of the first integrating circuit to which said input signal is applied and output of the second integrating circuit to which output of said inverter is applied after having being divided, and the output of said inverter or the output of said comparator is used as output signal.

* * * * *